United States Patent
Kitamura et al.

(10) Patent No.: US 7,663,220 B2
(45) Date of Patent: Feb. 16, 2010

(54) SEMICONDUCTOR DEVICE MODULE STRUCTURE

(75) Inventors: Kenji Kitamura, Sayama (JP); Shinichi Yataka, Sayama (JP); Takao Endo, Sayama (JP); Yuujiro Tominaga, Sayama (JP); Toshihide Tanaka, Sayama (JP); Koichiro Sato, Sayama (JP)

(73) Assignee: Honda Motor Co., Ltd., Tokyo (JP)

( * ) Notice: Subject to any disclaimer, the term of this patent is extended or adjusted under 35 U.S.C. 154(b) by 101 days.

(21) Appl. No.: 10/597,136

(22) PCT Filed: Nov. 30, 2004

(86) PCT No.: PCT/JP2004/018102

§ 371 (c)(1), (2), (4) Date: Jul. 12, 2006

(87) PCT Pub. No.: WO2005/069381

PCT Pub. Date: Jul. 28, 2005

(65) Prior Publication Data

US 2007/0138596 A1 Jun. 21, 2007

(30) Foreign Application Priority Data

Jan. 15, 2004 (JP) .............................. 2004-008022

(51) Int. Cl.
*H01L 23/52* (2006.01)
*H01L 23/34* (2006.01)

(52) U.S. Cl. ................. 257/691; 257/499; 257/500; 257/678; 257/712; 257/713; 257/718; 257/719; 257/720; 438/133; 438/309; 438/328

(58) Field of Classification Search ................ 257/565, 257/288, E23.106, E23.132, E23.187, E29.013, 257/E29.197, E29.198, E29.201, E29.027, 257/E29.328; 438/133, 309, 328
See application file for complete search history.

(56) References Cited

U.S. PATENT DOCUMENTS

| 6,703,707 B1 * | 3/2004 | Mamitsu et al. ............. 257/718 |
| 2003/0052400 A1 * | 3/2003 | Okura et al. ................ 257/691 |
| 2003/0122232 A1 * | 7/2003 | Hirano et al. ............... 257/678 |
| 2004/0066630 A1 * | 4/2004 | Whittenburg et al. ....... 361/719 |
| 2004/0118501 A1 * | 6/2004 | Chiu et al. .................... 156/64 |
| 2004/0195649 A1 * | 10/2004 | Miura et al. ................ 257/529 |

FOREIGN PATENT DOCUMENTS

| JP | 2000-124398 | 4/2000 |
| JP | 2000-156439 | 6/2000 |
| JP | 2002-033445 | 1/2002 |

* cited by examiner

*Primary Examiner*—Lynne A. Gurley
*Assistant Examiner*—Meiya Li
(74) *Attorney, Agent, or Firm*—Rankin, Hill & Clark LLP

(57) ABSTRACT

A semiconductor module includes: a semiconductor element (13) having a working unit (11) and a guard ring unit (12); and heat radiation members (15, 14) arranged on an upper surface and a lower surface of the semiconductor element for cooling the semiconductor element. A passivation film (20) covers the guard ring but does not cover the working unit. The upper heat radiation member (15) is made of a flat metal plate connected to the working unit without contact with the passivation film. The upper heat radiation member is connected to the lower heat radiation member (14) in the thermo-conducting way.

4 Claims, 6 Drawing Sheets

SEMICONDUCTOR DEVICE MODULE STRUCTURE

TECHNICAL FIELD

The present invention relates to a module structure of a semiconductor device and, more particularly, to a module structure of a semiconductor device having a heat-sinking mechanism on a device upper part in a semiconductor device including a power device such as an insulated gate bipolar transistor (IGBT).

BACKGROUND ART

As switching semiconductor elements for controlling relatively large currents, power devices are known. Power devices include power transistors and power MOSFETs and IGBTs and the like. Of these, IGBTs are used for example in inverters of electric vehicles as devices having the merits of ease of driving resulting from voltage drive and low loss resulting from conductivity modulating effect.

FIG. 5 shows the structure of a conventional IGBT module. This IGBT module 100 has a heat-sinking plate 104 for cooling a semiconductor element 103 having a working part 101 and a guard ring part 102. The heat-sinking plate 104 consists of a bottom heat-sinking plate joined to a substrate 105 consisting of an insulator provided below the working part 101 and the guard ring part 102. The semiconductor element 103 consists of an IGBT.

The working part 101 is made up of a high-resistance layer 106 of a first conductive type (N-type) semiconductor, a buffer layer 107 of the first conductive type ($N^+$-type) semiconductor positioned below that, a base layer 108 of a second conductive type (P-type) semiconductor formed in an upper part of the high-resistance layer 106 of the first conductive type semiconductor, an emitter region 109 of the first conductive type (N-type) semiconductor formed in an upper part of this base layer 108, an emitter electrode 110 contacted with this emitter region 109, and a gate electrode 112 formed insulated by an insulator 111 on a channel region of the base layer 108 of the second conductive type semi-conductor.

A collector layer 113 of the second conductive type ($P^+$-type) semi-conductor is formed on the underside of the buffer layer 107 of the first conductive type semiconductor. A collector electrode 114 is contacted with this collector layer 113.

The guard ring part 102 has a second conductive type (P-type) semiconductor layer 115 formed in an upper part of the N-type semiconductor layer 106 and an insulating film 116 of $SiO_2$ or the like deposited on the upper part of this semiconductor layer 115. The reference number 117 is a gate electrode lead wire.

Above the working part 101 and the guard ring part 102, over a part of the emitter electrode 110 and over the insulating film 116, for leak current suppression, the surface is covered with a passivation film 118 of polyamide or the like so that the $SiO_2$ that is the insulating film 116 does not become exposed.

The semiconductor constituting the semiconductor element 103 is made of silicon (Si). The emitter electrode 110 is made of aluminum silicon (AlSi). The collector electrode 114 is made of a metal 114a consisting of silver (Ag) or gold (Au) and a metal 114b consisting of nickel (Ni). The collector electrode 114 and the substrate 105 are joined with solder 119. The emitter electrode 110 is wired with a wire 120 made of aluminum or the like. The heat-sinking plate 104 is made of aluminum or copper or the like. The substrate 105 is joined to the heat-sinking plate 104 with solder 121.

FIG. 6 shows the structure of a conventional diode module. The diode module 200 shown in FIG. 6 has a heat-sinking plate 204 for cooling a semi-conductor element 203 having a working part 201 and a guard ring 202. The heat-sinking plate 204 is joined to a substrate 205 consisting of an insulator provided below the working part 201 and the guard ring 202. The semi-conductor element 203 is a diode.

The working part 201 is made up of a high-resistance layer 206 of a first conductive type (N-type) semiconductor, a semiconductor layer 207 of the first conductive type ($N^+$-type) positioned below that, a semiconductor layer 208 of a second conductive type ($P^+$-type) formed in an upper part of the high-resistance layer 206 of the first conductive type semiconductor, a cathode electrode 209 contacted with the semiconductor layer 208 of the second conductive type, and an anode electrode 210 contacted with the semiconductor layer 207 of the first conductive type.

The guard ring 202 is made up of a second conductive type (P-type) semiconductor layer 211 formed in an upper part of the N-type semiconductor layer 206 and an insulator 212 of $SiO_2$ or the like deposited on the upper part of this semiconductor layer 211. Over a part of the cathode electrode 209 and over the insulator 212 made of $SiO_2$, for leak current suppression, the surface is covered with a passivation film 213 of polyamide or the like so that the $SiO_2$ does not become exposed.

The semiconductor constituting the semiconductor element 203 is silicon (Si). The cathode electrode 209 is aluminum silicon (AlSi) or aluminum/titanium nickel/titanium (Al/TiNi/Ti). The anode electrode 210 is made up of a metal 210a such as silver (Ag) or gold (Au) and a metal 210b such as nickel (Ni). The anode electrode 210 and the substrate 205 are joined with solder 214. The cathode electrode 209 is wired with a wire 215 made of aluminum or the like. The heat-sinking plate 204 is made of aluminum or copper or the like. The substrate 205 is joined to the heat-sinking plate 204 with solder 216.

When these power devices are used in an inverter of an electric vehicle or the like, a large current of several hundred amperes (A) flows and the semi-conductor elements themselves produce heat. Because of this, in conventional art a heat sink or a water-cooling mechanism has been provided on the bottom (the collector electrode side) of the semiconductor element to cool it. However, it has sometimes happened that the cells on the top face side of the semiconductor element are not cooled and cells are destroyed.

With respect to this, technology in which heat is dissipated from the upper face of the semiconductor element by a flat metal plate (strap) being provided on the upper face side of the semiconductor element and doubling as both a lead from an electrode and a heat-sinking plate has been proposed for example in JP-A-2000-124398, JP-A-2000-156439 and JP-A-2002-33445.

For example, in JP-A-2000-124398, in a power semiconductor module formed with a power semiconductor chip mounted on an insulating substrate and a metal flat plate and having an interconnecting member having an electrode-facing part facing an electrode part of the power semiconductor chip, a vertical part extending bent from this electrode-facing part, and a readout part connecting with this vertical part, a power semiconductor module is disclosed in which the electrode part of the power semiconductor chip and the electrode-facing part of the interconnection member are joined with an electrically conducting resin.

In JP-A-156439, in a power semiconductor module in which a power semiconductor element is received in a box with its underside mounted on a heat-sinking plate, a power semiconductor module is disclosed in which a flat plate form or block form heat-sinking member joined to the upper face of the power semiconductor element and to the heat-sinking plate top is provided, and heat is dissipated to the heat-sinking plate from the upper face of the semi-conductor element via the heat-sinking member.

In JP-A-2002-33445, a semiconductor device is disclosed which is made by disposing 2 or more power elements on a main frame, in which at least active faces of the power elements are connected by way of a metal frame for connection.

In a semiconductor device in which a flat metal plate (strap) is provided on the upper face side of a semiconductor element to effect heat-sinking from the element upper face like this, the semiconductor element upper face and the strap are electrically connected by an adhesive having electrical conductivity and a certain amount of thermal conductivity such as solder or an electrically conducting resin.

Because of this, in the technologies disclosed in JP-A-2000-124398, JP-A-2000-156439 and JP-A-2002-33445 in which a flat metal plate (strap) is provided on the upper face side of the semiconductor element to effect heat-sinking from the element upper face, the heat-sinking characteristics of cells formed directly below the passivation film and other cells greatly differ. When cells operate in this kind of state, current flows, joule heat is produced, and a latchup phenomenon tends to occur. When latchup occurs, locally current flows and high heat is produced, and this has been a cause of cell breakdown such as PN junction breakdown.

And, in this case, because the coefficient of thermal expansivity of the strap, which is metal, differs from the coefficient of thermal expansivity of the semiconductor element (Si) and the passivation film (polyamide, SiN, SiO, SiON, PSG (Phosphorous Silicate Glass), $SiO_2$, NSG (Nondoped Silicate Glass) etc.) or the silicon substrate, cross-direction stresses act on the guard ring part below the passivation film due to heat production by the semiconductor element itself and thermal shocks in thermal shock testing, and cracking of the silicon substrate of the guard ring part occurs. Due to this cracking, as a result a voltage withstandability drop is brought about.

And, in conventional semiconductor elements, the passivation film has been formed as far as above the emitter electrode of the cell region, in consideration of side edges arising during pattern processing.

Accordingly, technology has been awaited for solving the problem of voltage withstandability drop resulting from stresses arising in the guard ring part due to differences in thermal expansion coefficient between the strap and the semiconductor element and the passivation film in a structure for effecting heat-sinking from the upper face of a semiconductor element, and solving the problem of cell breakdown arising because the heat dissipation characteristics greatly differ between cells directly below the passivation film and other cells.

DISCLOSURE OF THE INVENTION

In the present invention, a module structure of a semiconductor device is provided which is a module structure of a semiconductor device having a high-resistance layer of a first conductive type, a base layer of a second conductive type formed in an upper part of the high-resistance layer of the first conductive type, an emitter region of the first conductive type formed in an upper part of the base layer of the second conductive type, an emitter electrode connected to the emitter region, an insulated gate electrode adjacent to the base layer of the second conductive type, a guard ring part where diffusion around a cell region including the emitter region has been made deep, a passivation film formed on the upper part of the guard ring part and not extending onto the upper part of the cell region, a collector layer of the second conductive type formed on the underside of a buffer layer of the first conductive type, a collector electrode connected to the collector layer, and an upper heat-sinking part that is a metal flat plate connected to the emitter electrode at a height such that it is non-contacting with the passivation film.

By this means, it is possible to reduce stresses arising in the guard ring part and make voltage withstandability drop and cell breakdown unlikely to occur. That is, with this invention, it becomes possible to prevent cell breakdown caused by a strap doubling as a lead and a heat-sinking plate being mounted on the upper face side of a power semiconductor element and voltage withstandability drop caused by stresses acting on the guard ring part.

In the invention, preferably, the module structure of the semiconductor device further has a diode part, and a cathode electrode above the diode part and the upper heat-sinking part are connected. By this means it is possible to reduce stresses arising in the guard ring part and form a semiconductor device in which voltage withstandability drop and cell breakdown and element breakdown do not readily occur.

BEST MODE FOR CARRYING OUT THE INVENTION

Certain preferred embodiments of the present invention will now be described with reference to the accompanying drawings.

Figure 1:
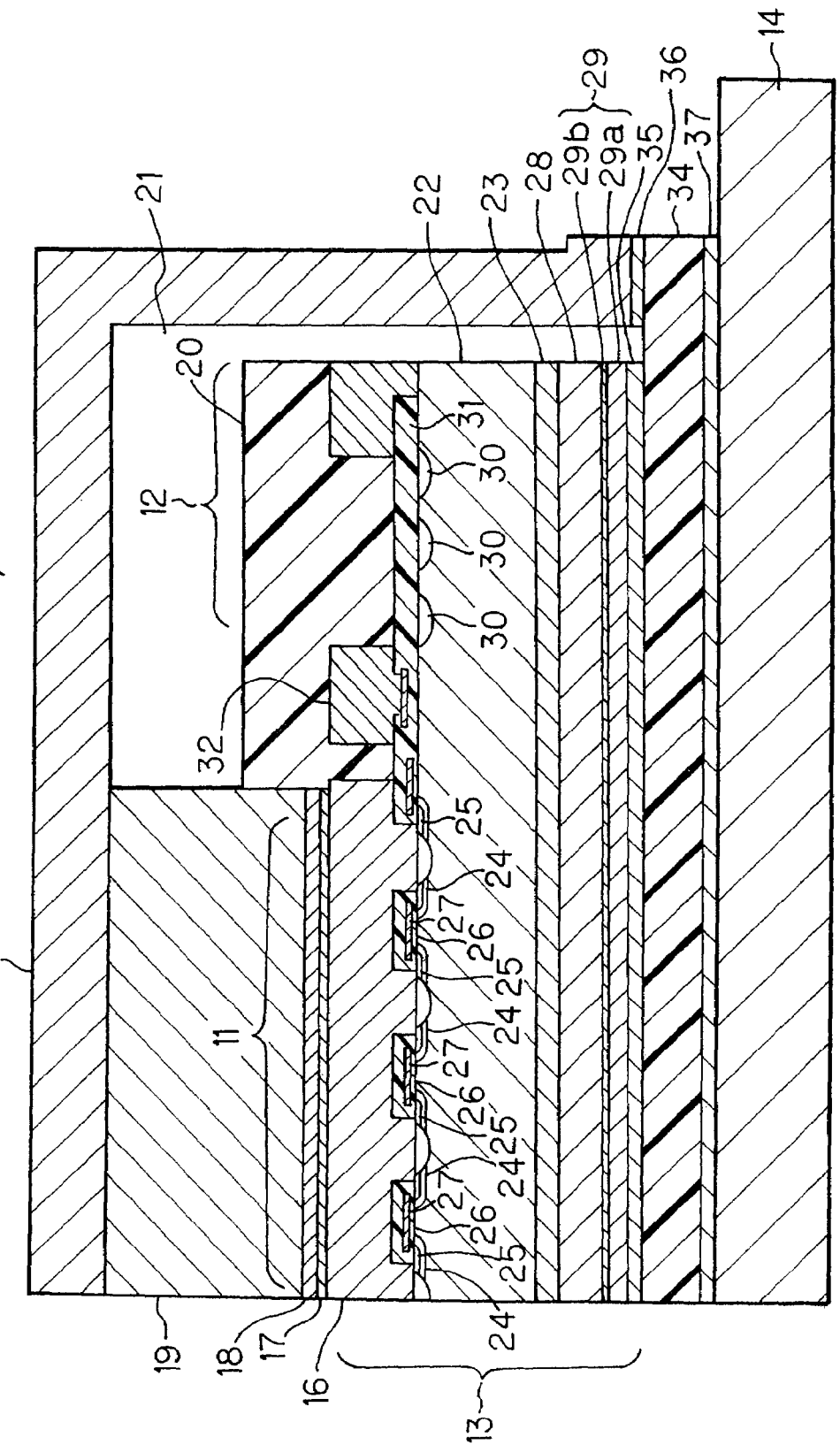
FIG. 1 is a sectional view showing, among semiconductor device module structures of the present invention, an IGBT module according to a first embodiment.

FIG. 1 is a sectional view showing a main part of a module structure of a semiconductor device according to a first embodiment of the invention. In this embodiment an insulated gate bipolar transistor (IGBT) is used as the semiconductor device. An IGBT module 10 has heat-sinking plates 14, 15 for cooling a semiconductor element 13 having a working part 11 and a guard ring part 12.

The heat-sinking plates 14, 15 are made up of a lower heat-sinking plate 14 joined to a substrate 34 made of an insulator provided below the working part 11 and the guard ring part 12, and an upper heat-sinking plate (strap) 15 having a part joined to an emitter electrode 16 at the upper part of the working part 11 via a metal 17, a metal 18 and an adhesive 19 and a part having a gap 21 provided between itself and a passivation film 20 deposited on the upper part of the guard ring part 12 and not joined thereto.

The metal 17 and the metal 18 are correlated metals of the emitter electrode 16 and the adhesive 19. The metal 18 is silver (Ag) or gold (Au) or the like. The metal 17 is nickel (Ni) or titanium/nickel (Ni/Ti) or the like.

The adhesive 19 is solder or an electrically conducting resin or the like. The passivation film 20 is made of polyamide, silicon nitride (SiN), silicon oxide (SiO), silicon oxynitride (SiON), phosphorus silicate glass (PSG), nondoped silicate glass (NSG), silicon dioxide ($SiO_2$) or the like. The semiconductor element 13 consists of an insulated gate bipolar transistor (IGBT).

The working part 11 has a high-resistance layer 22 of a first conductive type (N-type) semiconductor and a buffer layer 23 of the first conductive type ($N^+$-type) semiconductor positioned below that; a base layer 24 of a second conductive type ($P^+$-type) semiconductor formed in an upper part of the high-resistance layer 22 of the first conductive type semiconductor; an emitter region 25 of the first conductive type (N-type) semiconductor formed in an upper part of the base layer 24 of the second conductive type semiconductor; the emitter electrode 16, which is contacted with the emitter region 25; and a gate electrode 27, formed insulated by an insulator 26 above a channel region of the base layer 24 of the second conductive type semiconductor. A collector layer 28 of the second conductive type semiconductor is formed on the underside of the buffer layer 23 of the first conductive type semiconductor. A collector electrode 29 made up of a metal 29b such as silver (Ag) or gold (Au) and a metal 29a such as nickel (Ni) is contacted with the collector layer 28.

In the guard ring part 12, a second conductive type (P-type) semi-conductor layer 30 is formed in an upper part of the N-type semiconductor layer 22, and an insulating layer 31 such as $SiO_2$ is deposited above that. For leak current suppression, the surface of the guard ring part 12 is covered with a passivation film 20 of polyamide or silicon nitride (SiN), silicon oxide (SiO), silicon oxynitride (SiON) or the like so that the $SiO_2$ that is the insulating layer 31 does not become exposed. The passivation film 20 does not cover the upper part of the working part 11. The reference number 32 is a gate electrode lead line.

The semiconductor constituting this semiconductor device is for example silicon (Si), but it is not limited to that and may alternatively be a compound semiconductor such as gallium arsenide (GaAs). The emitter electrode 16 is aluminum silicon (AlSi). The collector electrode 29 and the substrate 34 are joined with solder 35. The lower heat-sinking plate 14 is made of aluminum or copper or the like. The upper heat-sinking plate (strap) 15 is also made of aluminum or copper or the like.

The substrate 34 consists of alumina or aluminum nitride or silicon nitride or the like with metal thin plates (not shown) made of copper or aluminum or the like adhered to both sides. The substrate 34 is joined onto the heat-sinking plate 14 with solder or the like 37. The collector electrode 29 is electrically connected to the metal thin plate on the top of the substrate 34 by an electrically conductive material such as the solder 35. The semiconductor element 13 is mounted on the lower heat-sinking plate 14 by way of the substrate 34. The upper heat-sinking plate (strap) 15 is joined to the substrate 34 with solder 36.

The IGBT module 10 is joined to a radiator such as a heat sink under the lower heat-sinking plate 14 by means of a grease having a high thermal conductivity or the like. Heat produced by the semiconductor element (IGBT element) 13 when the IGBT module 10 is operating is conducted to the radiator by way of the lower heat-sinking plate 14 and the upper heat-sinking plate 15 and radiated away. By this means the IGBT element 13 is cooled.

In an IGBT module 10 constructed like this, heat produced in the IGBT element 13 is conducted to the radiator from the underside of the IGBT element 13 on the collector electrode 29 side via the substrate 34 and the lower heat-sinking plate 14.

On the other hand at the upper face of the IGBT element 13, on the emitter electrode 16 side, the upper heat-sinking plate 15 is joined to the emitter electrode 16 of the IGBT element 13 by way of the adhesive 19, and also this upper heat-sinking plate 15 is joined to the substrate 34 by the solder 36 or the like. The upper heat-sinking plate 15, because it is of a flat plate shape having a large cross-sectional area, can be used as a thermal conduction path. Heat produced in the IGBT element 13 is also conducted to the radiator from the upper face of the IGBT element 13, on the emitter electrode 16 side of the IGBT element 13, via the adhesive 19, the upper heat-sinking plate 15, the substrate 34 and the lower heat-sinking plate 14.

Because heat produced in the IGBT element 13 is conducted to the radiator from both sides of the IGBT element 13, the emitter electrode 16 side and the collector electrode 29 side, compared to a module in which it is conducted to the radiator only from the collector electrode 29 side of the IGBT element 13 as in a conventional IGBT module, because there are more thermal conduction paths, the thermal resistance decreases. As a result, the cooling capacity of the IGBT module 10 increases, and the heating temperature of the IGBT element 13 can be reduced. And, because the upper heat-sinking plate 15 is made of metal, not only does it take on the dissipation of heat from the IGBT element 13, it also constitutes part of the electrical interconnection connecting the IGBT element 13 and an external electrode terminal (not shown) for the emitter, and is used as an electrical interconnection.

Also, because there is the gap 21 between the upper heat-sinking plate 15 and the passivation film 20 on the guard ring part 12, and it is not joined to the passivation film 20, even if the thermal expansion of the upper heat-sinking plate 15 and the thermal expansion of the passivation film 20 and the guard ring part 12 of when there has been a temperature rise are different, thermal stress does not arise in the silicon substrate where the N-type high-resistance layer 22 and the P-type semiconductor layer 30 and the $N^+$-type the buffer layer 23 and the collector layer 28 of the guard ring part 12 are formed, and the occurrence of cracking in that silicon substrate can be suppressed, and voltage withstandability drop resulting from cracking can be avoided. And, because since the passivation film 20 is only on the guard ring part, nonuniformity of the temperature inside the semiconductor caused by joule heat can be avoided, latchup does not readily occur and cell breakdown can be reduced.

Figure 2:
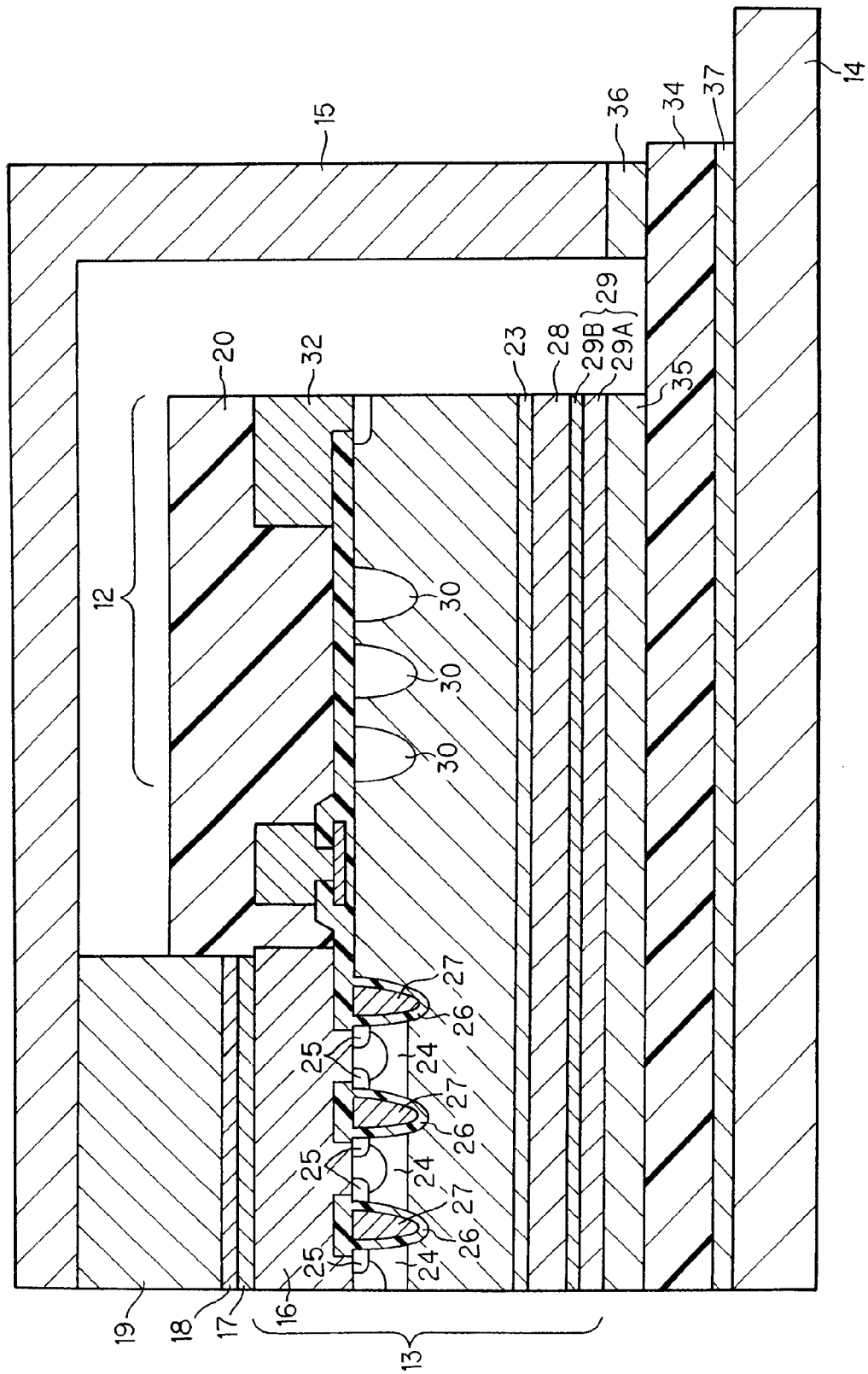
FIG. 2 is a sectional view showing an example in which the semi-conductor device module structure of the first embodiment has been made a trench structure.

A structure like that described above can also be used for an element having a trench structure like that shown in FIG. 2. FIG. 2 shows the present invention applied to a device having a trench structure. Although the structure of the cell region (the working part 11) is different, it is the same in the point that the passivation film 20 is not provided on the cell region and in the point that because the upper heat-sinking plate is non-contacting with the passivation film it does not apply stress, which are main parts of the invention. And, as reference numerals in FIG. 2, the same reference numerals have been assigned to members having the same function as in the structure in FIG. 1.

Figure 3:
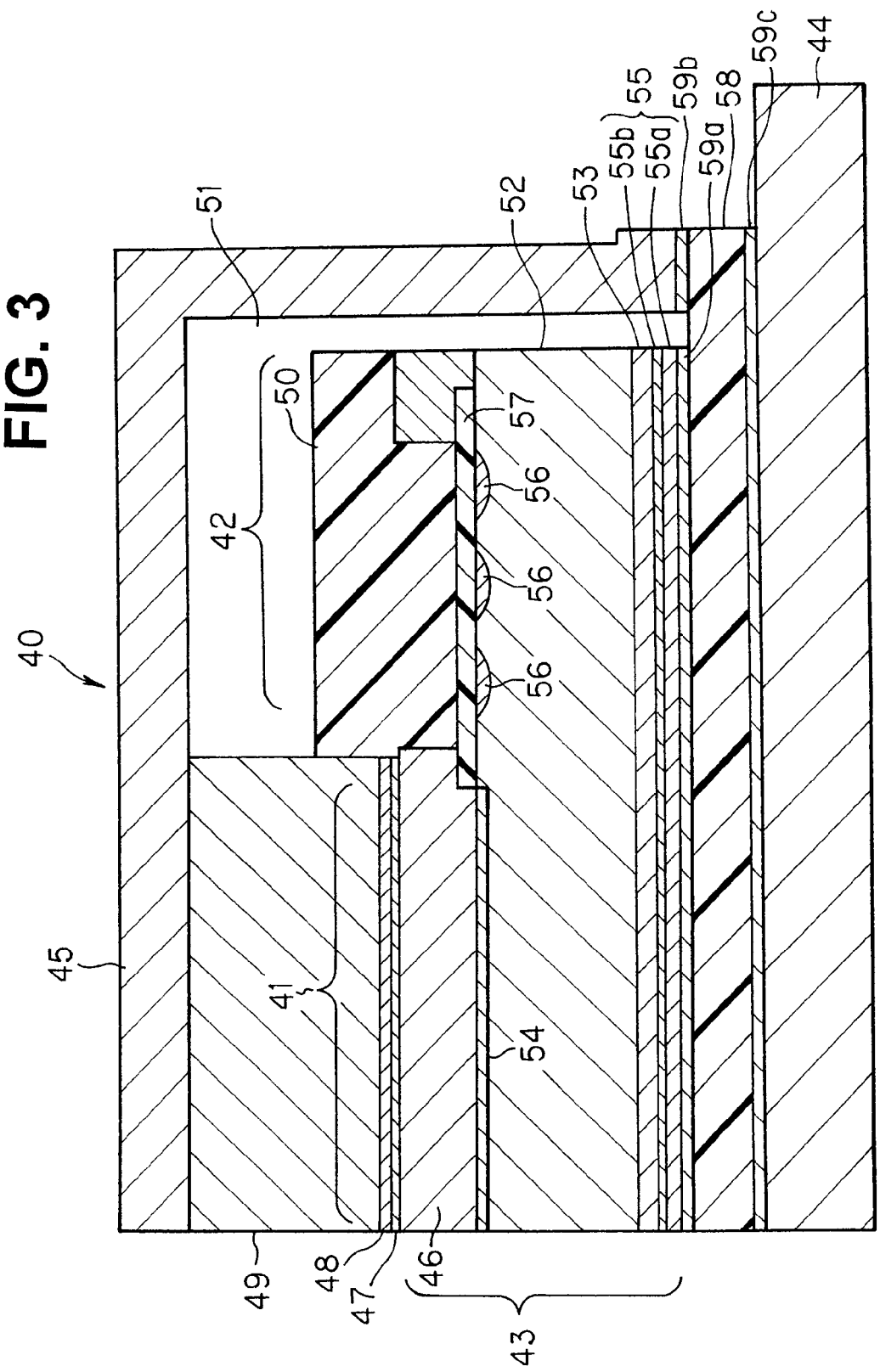
FIG. 3 is a sectional view showing, among semiconductor device module structures of the present invention, a diode module according to a second embodiment.

FIG. 3 is a sectional view showing a module structure of a semiconductor device according to a second embodiment. In this embodiment, a semiconductor element constituting the semiconductor device is a diode. A diode module 40 has heat-sinking plates 44, 45 for cooling a semiconductor element 43 having a working part 41 and a guard ring part 42.

The heat-sinking plates 44, 45 consist of a lower heat-sinking plate 44 joined to a substrate 58 made of an insulator provided below the working part 41 and the guard ring part 42, and an upper heat-sinking plate (strap) 45 having a part joined to a cathode electrode 46 at the top of the working part 41 by way of a metal 47, a metal 48 and an adhesive 49, and a part having a gap 51 provided between itself and a passivation film 50 deposited on the upper part of the guard ring part 42 and not joined thereto.

The metal 47 and the metal 48 are correlated metals of the cathode electrode 46 and the adhesive 49. The metal 47 is silver (Ag) or gold (Au) or the like. The metal 48 is nickel (Ni) or titanium/nickel (Ni/Ti) or the like.

The adhesive 49 is solder or an electrically conducting resin or the like. The passivation film 50 is made of polyamide, silicon nitride (SiN), silicon oxide (SiO), silicon oxynitride (SiON), phosphorus silicate glass (PSG), nondoped silicate glass (NSG), silicon dioxide ($SiO_2$) or the like. The semiconductor element 43 consists of a diode.

The working part 41 has a high-resistance layer 52 of a first conductive type (N-type) semiconductor, a semiconductor layer 53 of the first conductive type ($N^+$-type) positioned below that, a semiconductor layer 54 of a second conductive type ($P^+$-type) formed in an upper part of the high-resistance layer 52 of the first conductive type (N-type) semiconductor, the cathode electrode 46 contacted with the second conductive type semiconductor layer 54, and an anode electrode 55 made up of a metal 55b such as silver (Ag) or gold (Au) contacted with the first conductive type semiconductor layer 53 and a metal 55a such as nickel (Ni).

In the guard ring part 42, a second conductive type (P-type) semi-conductor layer 56 is formed in an upper part of the N-type semiconductor layer 52, and an insulating layer 57 of $SiO_2$ or the like is deposited on the upper part of that. For leak suppression, the surface of the guard ring part 42 is covered by a passivation film 50 of polyamide or silicon nitride (SiN), silicon oxide (SiO), silicon oxynitride (SiON), phosphorus silicate glass (PSG), nondoped silicate glass (NSG), silicon dioxide ($SiO_2$) or the like, so that the $SiO_2$ that is the insulating layer 57 does not become exposed. The passivation film 50 does not cover the top of the working part 41.

The semiconductor constituting this semiconductor device is for example silicon (Si), but it is not limited to that and may alternatively be a compound semiconductor such as gallium arsenide (GaAs). The cathode electrode 46 is aluminum silicon (AlSi). The anode electrode 55 and the substrate 58 are joined with solder 59a. The lower heat-sinking plate 44 is made of aluminum or copper or the like. The upper heat-sinking plate (strap) 45 is also made of aluminum or copper or the like.

The substrate 58 is made of aluminum or aluminum nitride or the like with metal thin plates (not shown) made of copper or the like adhered to both sides. The substrate 58 is joined to the top of the lower heat-sinking plate 44 with solder or the like. The anode electrode 55 is electrically connected to the metal thin plate on the top of the substrate 58 with an electrically conducting material such as solder 59a. The semiconductor element 43 is mounted on the lower heat-sinking plate 44 by way of the substrate 58. The upper heat-sinking plate (strap) 45 is joined to the substrate 58 by solder 59b.

The diode module 40 is joined to a radiator such as a heat sink below the lower heat-sinking plate 44 by a highly thermally conductive grease or the like. Heat produced in the semiconductor element (diode element) 43 when the diode module is operating is conducted to the radiator through the lower heat-sinking plate 44 and the upper heat-sinking plate 45 and radiated away. By this means the diode element 43 is cooled.

In a diode module 40 constructed like this, heat produced in the diode element 43 is conducted to the radiator from the underside of the diode element 43, on the anode electrode 55 side, via the substrate 58 and the lower heat-sinking plate 44.

On the other hand, on the upper face of the diode element 43 on the cathode electrode 46 side, the upper heat-sinking plate 45 is joined to the cathode electrode 46 of the diode element 43 via the adhesive 49. This upper heat-sinking plate 45 is joined to the substrate 58 by the solder 59b or the like. The upper heat-sinking plate 45, because it has a flat plate shape with a large cross-sectional area, can be used as a thermal conduction path. Heat produced in the diode element 43 is also conducted to the radiator from the upper face of the diode element 43, on the cathode electrode 46 side of the diode element 43, via the adhesive 49, the upper heat-sinking plate 45, the substrate 58 and the lower heat-sinking plate 44.

Because heat produced in the diode element 43 is conducted to the radiator from both sides of the diode element 43, the cathode electrode 46 side and the anode electrode 55 side, compared to a module in which it is conducted to the radiator only from the anode electrode 55 side of the diode element 43, as in conventional diode modules, because there are more thermal conduction paths the thermal resistance decreases. As a result of this the cooling capacity of the diode module 40 increases, and the heat-production temperature of the diode element 43 can be reduced. And, because the upper heat-sinking plate 45 is made of metal, not only does it take on the dissipation of heat from the diode element 43, it also constitutes part of the electrical connection connecting the diode element 43 and an external electrode terminal (not shown) for the cathode, and can be used as an electrical interconnection.

Also, because there is the gap 51 between the upper heat-sinking plate 45 and the passivation film 50 on the guard ring part 42 upper part and it is not joined to the passivation film 50, even if the thermal expansion of the upper heat-sinking plate 45 and the thermal expansion of the passivation film 50 and the guard ring part 42 of when there has been a temperature rise are different, thermal stress does not arise in the silicon substrate where the N-type high-resistance layer 52 and the P-type semiconductor layer 56 and the $N^+$-type semiconductor layer 53 are formed, and the occurrence of cracking in that silicon substrate can be suppressed, and a voltage withstandability drop resulting from cracking can be avoided. And, because since the passivation film 50 is only on the guard ring part upper part nonuniformity of the temperature inside the semiconductor caused by joule heat can be avoided, latchup does not readily occur, and cell breakdown can be reduced.

Figure 4:
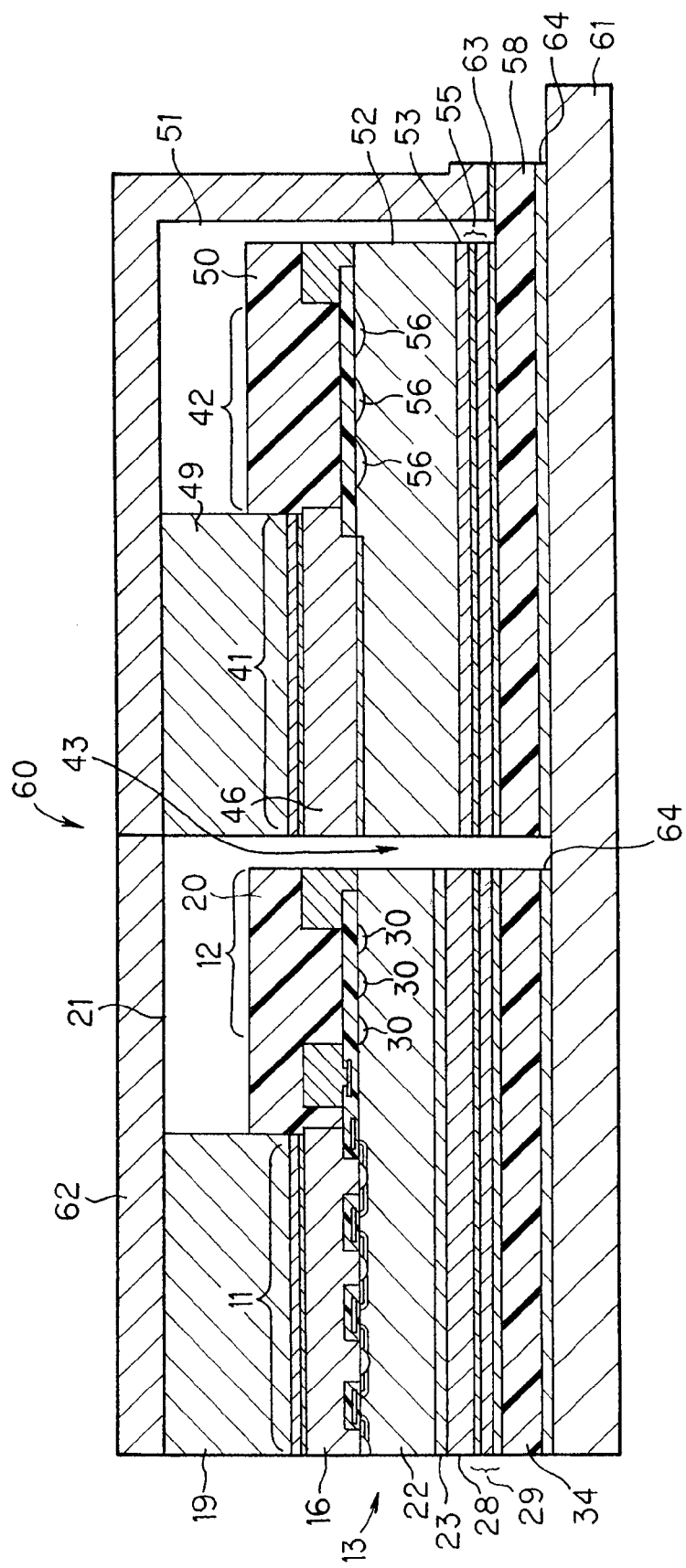
FIG. 4 is a sectional view showing a semiconductor device module structure which is a third embodiment, made up of an IGBT module according to the first embodiment and a diode module according to the second embodiment.
Figure 5:
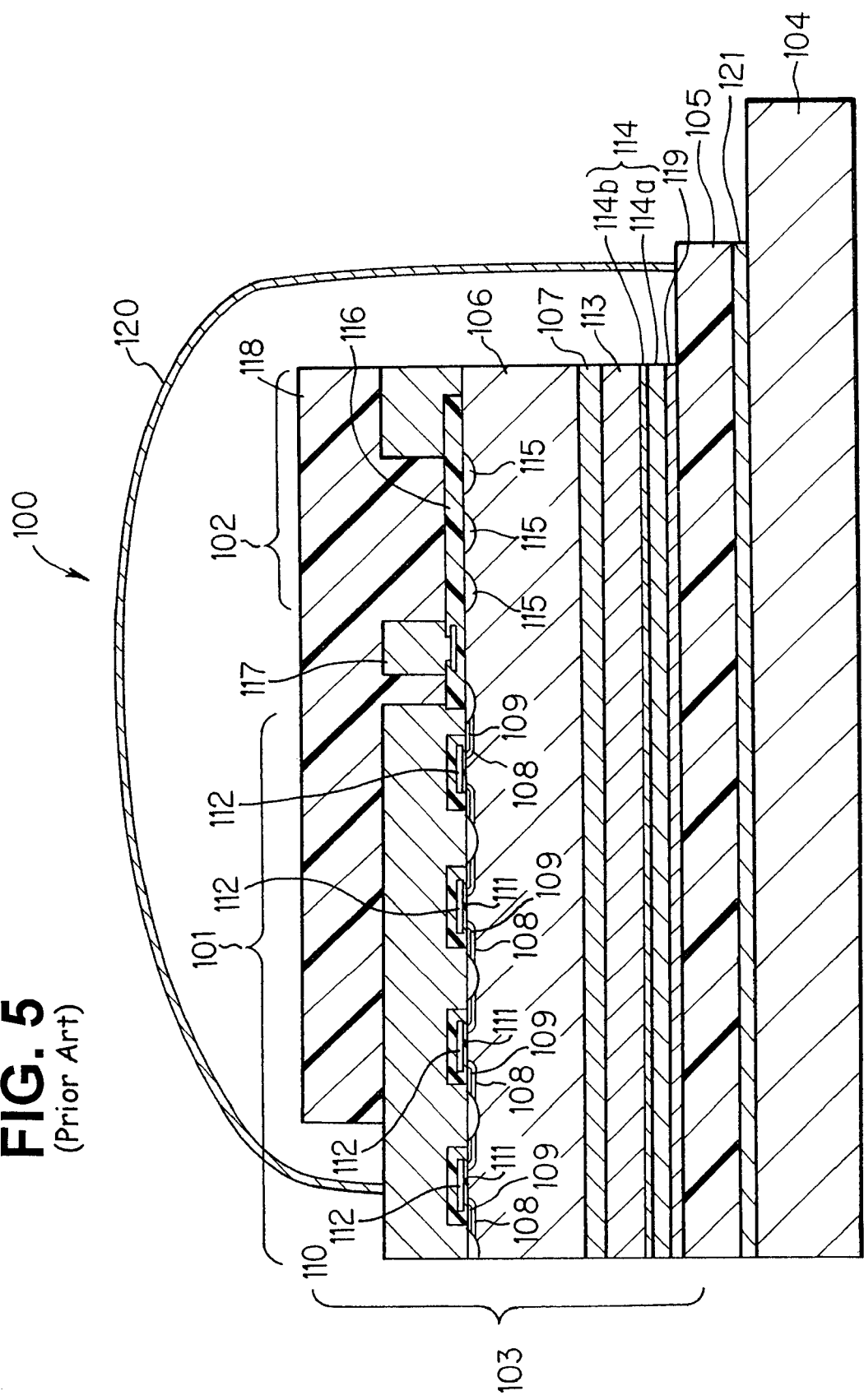
FIG. 5 is a sectional view showing the structure of a conventional IGBT module.
Figure 6:
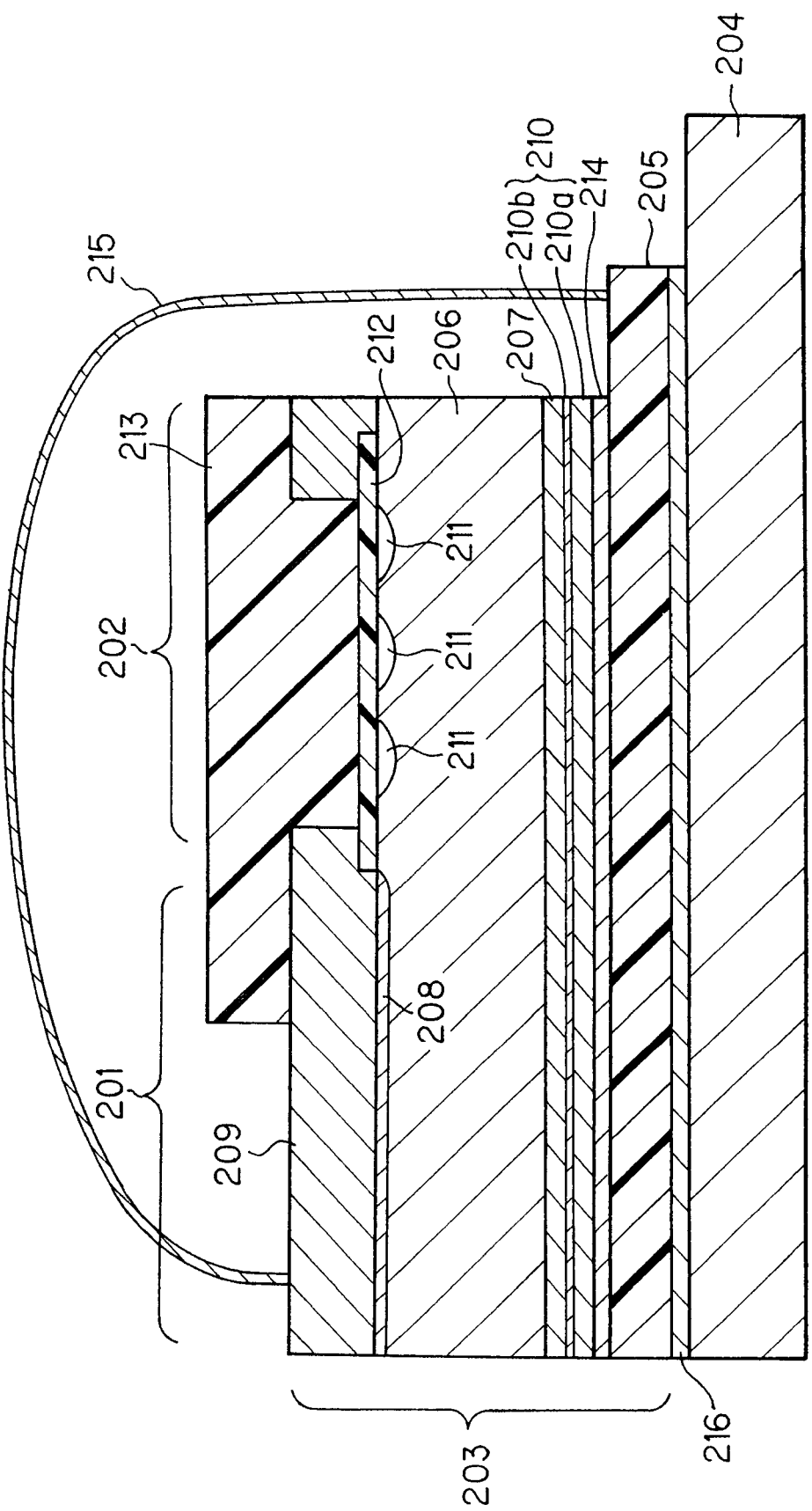
FIG. 6 is a sectional view showing the structure of a conventional diode module.

FIG. 4 is a sectional view showing a main part of a module structure of a semiconductor device according to a third embodiment of the invention. The semiconductor device module 60 in this embodiment has an insulated gate bipolar transistor (IGBT) and a diode. Because the IGBT element is the same as the structure described in the first embodiment, the same reference numerals as those shown in FIG. 1 have been assigned, and because the diode element is the same as the structure described in the second embodiment the same reference numerals as those shown in FIG. 3 have been assigned, and a detailed description of their element structures will be omitted.

To explain briefly, the semiconductor device module 60 of the third embodiment has heat-sinking plates 61, 62 for cooling a semiconductor element (IGBT element) 13 and a semiconductor element (diode element) 43. The heat-sinking plates 61, 62 consist of a lower heat-sinking plate 61 provided below the semiconductor elements 13, 43 and an upper heat-sinking plate 62 having parts joined to the electrodes 16, 46 at the tops of the working parts 11, 41 and parts not joined to the passivation films 20, 50 deposited on the guard ring parts 12, 42.

The semiconductor device module 60 is joined to a radiator such as a heat sink below the lower heat-sinking plate 61 with a highly thermally conductive grease or the like. Heat produced in the IGBT element 13 and the diode element 43 when the diode module 60 is operating is conducted to the radiator through the lower heat-sinking plate 61 and the upper heat-sinking plate 62 and radiated away. By this means the IGBT element 13 and the diode element 43 are cooled.

In a semiconductor device module 60 constructed like this, heat produced in the IGBT element 13 and the diode element 43 is conducted to the radiator from the underside of the IGBT element 13, on the collector electrode 29 side, via the substrate 34 and the lower heat-sinking plate 61, and is conducted to the radiator from the underside of the diode element 43, on the anode electrode 55 side, via the substrate 58 and the lower heat-sinking plate 61.

On the other hand, on the upper face of the IGBT element 13 on the emitter electrode 16 side, the upper heat-sinking plate 62 is joined to the emitter electrode 16 of the IGBT element 13 via the adhesive 19. On the upper face of the diode element 43 on the cathode electrode 46 side, the upper heat-sinking plate 62 is joined to the cathode electrode 46 of the diode element 43 via the adhesive 49.

The upper heat-sinking plate 62 is joined to the substrate with solder 63. Because the upper heat-sinking plate 62 has a flat plate shape with a large cross-sectional area, it can be used as a thermal conduction path. Heat produced in the IGBT element 13 is also conducted to the radiator from the IGBT element 13 upper face on the emitter electrode 16 side of the IGBT element 13, via the adhesive 19, the upper heat-sinking plate 62, the substrate 58 and the lower heat-sinking plate 61. Heat produced in the diode element 43 is also conducted to the radiator from the diode element 43 upper face on the cathode electrode 46 side of the diode element 43, via the adhesive 49, the upper heat-sinking plate 62, the substrate 58 and the lower heat-sinking plate 61.

Thus, heat produced in the IGBT element 13 is conducted to the radiator from both sides, the emitter electrode 16 side and the collector electrode 29 side, of the IGBT element 13. Heat produced in the diode element 43 is conducted to the radiator from both sides, the cathode electrode 46 side and the anode electrode 55 side, of the diode element 43. Because of this, compared to a module in which heat is conducted to the radiator only from the collector electrode side of the IGBT element and the anode electrode side of the diode element as in a conventional semiconductor device module, because there are more thermal conduction paths the thermal resistance decreases. As a result the cooling capacity of the semiconductor device module increases, and the heat-production temperature of the IGBT element 13 and the diode element 43 can be reduced. And, because the upper heat-sinking plate 62 has been made with metal, not only does it take on the dissipation of heat from the IGBT element 13 and the diode element 43, it also constitutes part of the electrical connection connecting the IGBT element 13 and an external electrode terminal for the emitter and connecting the diode element 43 and an external electrode terminal for the cathode, and is used as an electrical interconnection.

Because there is the gap 21 between the upper heat-sinking plate 62 and the passivation film 20 on the guard ring part 12 upper part and it is not joined to the passivation film 20, even if the thermal expansion of the upper heat-sinking plate 62 and the thermal expansion of the passivation film 20 and the guard ring part 12 of when there has been a temperature rise are different, thermal stress does not arise in the silicon substrate where the N-type high-resistance layer 22 and the P-type semiconductor layer 30, the N$^+$-type buffer layer 23 and the collector layer 28 are formed, the occurrence of cracking in that silicon substrate can be suppressed, and a voltage withstandability drop resulting from cracking can be avoided. And, because since the passivation film 20 is only on the guard ring part upper part, nonuniformity of the temperature inside the semiconductor caused by joule heat can be avoided, latchup does not readily occur, and cell breakdown can be reduced.

Also, because there is the gap 51 between the upper heat-sinking plate 42 and the passivation film 50 on the guard ring part 42 and it is not joined to the passivation film 50, even if the thermal expansion of the upper heat-sinking plate 62 and the thermal expansion of the passivation film 50 and the guard ring part 42 of when there has been a temperature rise are different, thermal stress does not arise in the silicon substrate where the N-type high-resistance layer 52 and the P-type semiconductor layer 56 and the N$^+$-type semiconductor layer 53 are formed, the occurrence of cracking in that silicon substrate can be suppressed, and a voltage withstandability drop caused by cracking can be avoided. And, because since the passivation film 50 is only on the guard ring part upper part, nonuniformity of the temperature inside the semiconductor caused by joule heat can be avoided, latchup does not readily occur, and cell breakdown can be reduced.

Although this embodiment has been explained using an N-type semi-conductor as the first conductive type semiconductor and using a P-type semi-conductor as the second conductive type semiconductor, it is not limited to this, and alternatively a P-type semiconductor may be used as the first conductive type semiconductor and an N-type semiconductor used as the second conductive type semiconductor.

INDUSTRIAL APPLICABILITY

As described above, with this invention, because by a strap doubling as a lead and a heat-sinking plate being mounted on the upper face side of a semi-conductor element cell breakdown and element breakdown occurring as a result of thermal stress and voltage withstandability drop caused by stresses acting on the guard ring part can be prevented, it is useful in a power device such as a power semiconductor module in which a large current flows.

The invention claimed is:

1. A semiconductor device module structure comprising:
   a high-resistance layer of a first conductive type;
   a base layer of a second conductive type formed in an upper part of the high-resistance layer of the first conductive type;
   an emitter region of the first conductive type formed in an upper part of the base layer of the second conductive type;
   an emitter electrode connected to the emitter region;
   an insulated gate electrode adjacent to the base layer of the second conductive type;
   a guard ring part formed around a cell region including the emitter region;
   a buffer layer of the first conductive type formed on an underside of the high-resistance layer of the first conductive type;

a collector layer of the second conductive type formed on an underside of the buffer layer of the first conductive type;

a collector electrode connected to the collector layer; and a metal flat plate upper heat-sinking part connected to the emitter electrode, wherein the guard ring part comprises:

a semiconductor layer of the second conductive type disposed on the upper part of the high-resistance layer of the first conductive type and located around the emitter region;

an insulating layer formed on an upper part of the semiconductor layer of the second conductive type; and a passivation layer covering the insulating layer without covering the cell region, wherein a gap is formed between the passivation layer and the upper heat-sinking part such that the passivation layer does not directly contact the upper heat-sinking part.

2. The semiconductor device module structure of claim 1, wherein the semiconductor device module structure comprises a diode part, and wherein a cathode electrode located in an upper part of the diode part between the high-resistance layer and the upper heat-sinking part is connected to the upper heat-sinking part.

3. The semiconductor device module structure of claim 1, wherein one end of the metal flat plate upper heat-sinking part is connected to the emitter electrode and the opposite end of the metal flat plate heat-sinking part is connected to a substrate.

4. The semiconductor device module structure of claim 1, wherein the first conductive type is either an N-type or an $N^+$-type, and wherein the second conductive type is either a P-type or a $P^+$-type.

* * * * *